United States Patent [19]
Yamaha et al.

[11] Patent Number: 5,793,110
[45] Date of Patent: Aug. 11, 1998

[54] MOS TRANSISTOR WITH GOOD HOT CARRIER RESISTANCE AND LOW INTERFACE STATE DENSITY

[75] Inventors: Takahisa Yamaha; Seiji Hirade, both of Hamamatsu, Japan

[73] Assignee: Yamaha Corporation, Japan

[21] Appl. No.: 601,736

[22] Filed: Feb. 15, 1996

[30] Foreign Application Priority Data

Feb. 17, 1995 [JP] Japan ..................... 7-053391

[51] Int. Cl.⁶ .................. H01L 23/48; H01L 23/52; H01L 29/40
[52] U.S. Cl. .................. 257/750; 257/751; 257/763; 257/637
[58] Field of Search .................. 257/750, 751, 257/342, 343, 298, 763, 637; 437/192, 195

[56] References Cited

U.S. PATENT DOCUMENTS

| | | | |
|---|---|---|---|
| 3,769,670 | 11/1973 | Schrank . | |
| 4,764,481 | 8/1988 | Alvi et al. | 257/750 |
| 4,824,803 | 4/1989 | Us et al. | 257/750 |
| 4,936,950 | 6/1990 | Doan et al. | 257/750 |
| 5,138,412 | 8/1992 | Hieda et al. | 257/750 |
| 5,192,989 | 3/1993 | Matsushita et al. | 257/750 |
| 5,237,187 | 8/1993 | Suwanai et al. | 257/298 |
| 5,254,497 | 10/1993 | Liu | 437/173 |
| 5,275,972 | 1/1994 | Ogawa et al. . | |
| 5,424,570 | 6/1995 | Sardella et al. . | |

FOREIGN PATENT DOCUMENTS 555199  3/1993  Japan .

*Primary Examiner*—Sara W. Crane
*Assistant Examiner*—Phat X. Cao

[57] ABSTRACT

After a MOS transistor having a gate electrode layer is formed on the surface of a semiconductor substrate, a first interlayer insulating film and a moisture blocking film are sequentially formed. After necessary contact holes are formed in the films, a first wiring layer is deposited and patterned together with the underlying blocking film, to form wiring layers for the connection to the transistor regions and a moisture blocking pattern covering the gate electrode layer. The first wiring layer includes a lowest Ti layer, Al alloy layer, and other layers. After a second interlayer insulating film is formed covering the first wiring layers, a second wiring layer is formed on the second interlayer insulating film. The second interlayer insulating film contains a spin-on-glass film which contains moisture. The wiring material layer prevents diffusion of moisture from the second interlayer insulating film to the electrode layer, and the moisture blocking film prevents the absorption and store of moisture related species ($H_2O$, $OH^-$, $H^+$) by the Ti layer of the wiring material layer.

22 Claims, 7 Drawing Sheets

(PRIOR WORK)

MOS TRANSISTOR WITH GOOD HOT CARRIER RESISTANCE AND LOW INTERFACE STATE DENSITY

BACKGROUND OF THE INVENTION a) Field of the Invention

The present invention relates to semiconductor devices such as LSIs and more particularly to semiconductor devices with a moisture invasion blocking structure.

b) Description of the Related Art

In conventional techniques of planarizing an interlayer insulating film of a semiconductor device such as a metal-oxide-semiconductor (MOS) type LSI, it is known to use a stacked laminate film of a spin-on-glass (SOG) film and other films for the interlayer insulating film.

FIG. 3 is a cross sectional view showing part of a MOS type LSI using conventional planarizing techniques. On the surface of a semiconductor substrate 10 made of p-type silicon, a gate electrode layer G is formed through a gate insulating film OX. A source region LS and a drain region LD of an n-type low impurity concentration are formed by ion implantation or other processes. Side spacers SP of silicon oxide are formed on both sides of the gate electrode layer G, and thereafter, a source region S and a drain region D of an $n^+$-type high impurity concentration are formed continuously with and partly overlapping the low impurity concentration regions LS and LD, by ion implantation or other processes.

Next, an insulating film 14 is formed over the substrate, covering the MOS type transistor formed in the above manner. The insulating film may be a borophosphosilicate glass (BPSG) film formed by CVD (chemical vapor deposition).

Next, contact holes such as source and drain contact holes are formed in the insulating film 14 for exposing the source and drain regions S and D, etc. A wiring material layer is deposited over the substrate and patterned to form a source wiring layer 16 and a drain wiring layer 17 serving as the first-level wiring layer. The wiring layers 16 and 17 may be, as shown in FIG. 5, a laminate of a Ti layer 16a, a TiN layer 16b, an Al alloy layer (e.g., Al-Si-Cu) 16c, and a TiN layer 16d stacked in this order from the bottom. The Ti layer 16a is used for reducing a contact resistance with a silicon surface. The TiN layer 16b is used for giving a barrier function. The TiN layer 16d is used for preventing light reflection during a photolithography process.

Next, an interlayer insulating film 18 is formed on the insulating film, covering the wiring layers 16 and 17. The insulating film 18 may be a laminate of a silicon oxide film 20 formed by plasma-enhanced CVD (PECVD) using tetraethylorthosilicate (TEOS), a flat SOG film 22 formed on the silicon oxide film 20 by spin-coating, and another silicon oxide film 24 formed on the SOG Film 22 by plasma-enhanced CVD using TEOS.

Thereafter, a second-level wiring layer 26 is formed on the insulating film 18, and a passivation film 28 is formed covering the wiring layer 26. The substrate is annealed in a hydrogen containing atmosphere at about 400° C. The passivation film 28 may be a silicon nitride film formed by plasma-enhanced CVD.

With this structure, however, it is difficult to lower the interface state density at the semiconductor surface.

SUMMARY OF THE INVENTION

It is an object of the present invention to provide a semiconductor device having a low interface state density.

It is another object of the present invention to provide a semiconductor device capable of preventing moisture from entering active regions and lowering an interface state density.

According to one aspect of the present invention, there is provided a method for manufacturing a semiconductor device, comprising the steps of: (a) providing a semiconductor substrate having an active element; (b) forming a first moisture impervious layer over the active element; (c) forming a second moisture impervious layer over the active element and the first moisture impervious layer, the second moisture impervious layer having hydrogen absorbing property; (d) forming a hole through the first moisture impervious layer and the second moisture impervious layer; and (e) forming an interlayer insulating layer, which includes moisture contents therein degrading performances of the active elements, over the first moisture impervious layer and the conductive blocking layer.

According to another aspect of the present invention, there is provided a semiconductor device comprising: (a) a substrate having an active element; (b) a first moisture impervious layer formed over the active element; (c) a second moisture impervious layer formed over the active element and the first moisture impervious layer, the second moisture impervious layer having hydrogen absorbing property; and (d) an interlayer insulating layer, which includes moisture contents therein degrading performances of the active elements, formed over the first moisture impervious layer and the second moisture impervious layer.

The first moisture impervious layer is preferably a silicon nitride layer. The second moisture impervious layer includes preferably a titanium layer formed on the first moisture impervious layer and a wiring layer of other metal formed on the titanium layer.

The wiring layer has a function of blocking moisture related species ($H_2O$, $OH^-$, $H^+$). Although the titanium layer has a property of absorbing moisture related species, it does not absorb excessively moisture related species from the underlying layer because the first moisture impervious layer is formed under the bottom of the titanium layer. In the case of a MOS transistor, it is preferable to cover the upper portion of a gate electrode with first and second moisture impervious layers separated from at least one of the source and drain electrodes. With this structure, moisture can be prevented from being diffused into the gate electrode, and $H^+$ can be supplied to an insulating layer over the semiconductor surface. Therefore, degradation of resistance to hot carriers can be prevented and the density of surface or interface level can be lowered. MOS LSIs of high reliability can therefore be manufactured.

According to another aspect of the present invention, there is provided a method for manufacturing a semiconductor device, comprising the steps of: (a) providing a semiconductor substrate having an active element; (b) forming a first interlayer insulating layer over the semiconductor substrate and the active element; (c) forming a first moisture impervious layer held in contact with the first interlayer insulating layer; (d) forming a second moisture impervious layer having a titanium layer at the lowermost layer, the second moisture impervious layer being held in contact with the first moisture impervious layer; and (e) patterning a lamination of the first moisture impervious layer and the second moisture impervious layer to form a hole therethrough.

According to another aspect of the present invention, there is provided a semiconductor device comprising: (a) a semiconductor substrate having an active element; (b) a first interlayer insulating layer over the semiconductor substrate and the active element; (c) a first moisture impervious layer being held in contact with the first interlayer insulating layer; (d) a second moisture impervious layer having a titanium layer at a lowermost layer, the second moisture impervious layer being held in contact with the first moisture impervious layer; and (e) a second interlayer insulating layer, which includes moisture contents therein degrading performances of the active elements, formed over the first moisture impervious layer and the second moisture impervious layer.

DETAILED DESCRIPTION OF THE PREFERRED EMBODIMENTS

Prior to giving the description of the embodiments of the invention, the analysis made by the present inventors will be described in order to help understand the invention.

Figure 3:
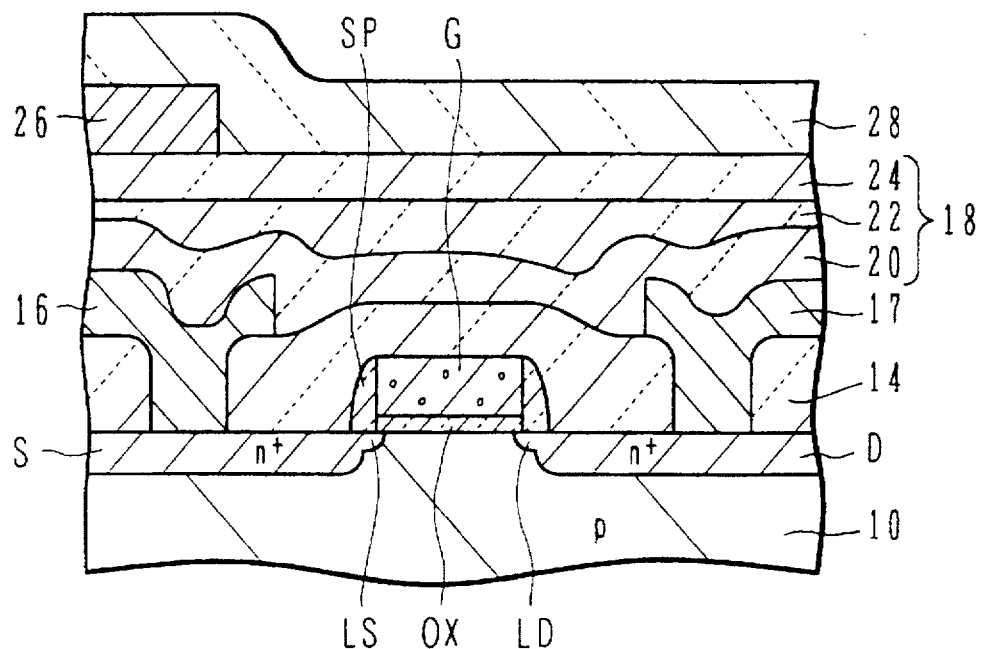
FIG. 3 is a cross sectional view showing an example of the substrate of a conventional semiconductor device.

In the structure shown in FIG. 3, the interlayer insulating film 18 is made of a laminate of insulating films including an SOG film which is absorbent and contains a plenty of moisture. Moisture diffuses from the insulating film 18 into the gate electrode layer G, posing a problem of degrading resistance to hot carriers of a MOS type transistor.

Figure 4:
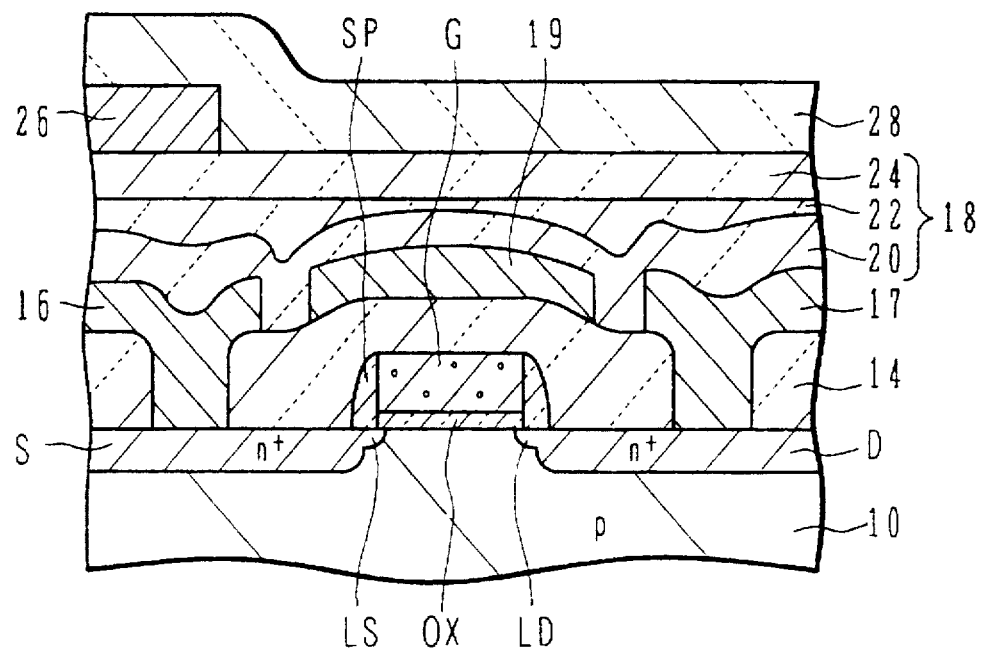
FIG. 4 is a cross sectional view showing an example of the substrate of a semiconductor device previously proposed.

In order to solve this problem, one of the present inventors has proposed a semiconductor device having the structure shown in FIG. 4 (Japanese Patent Application No. 6-247154, corresponding to U.S. patent application Ser. No. 08/526,603 filed on Sep. 11, 1995 which is herein incorporated by reference). In FIG. 4, like elements to those shown in FIG. 3 are represented by using identical reference numerals, and the description thereof is omitted.

Figure 5:
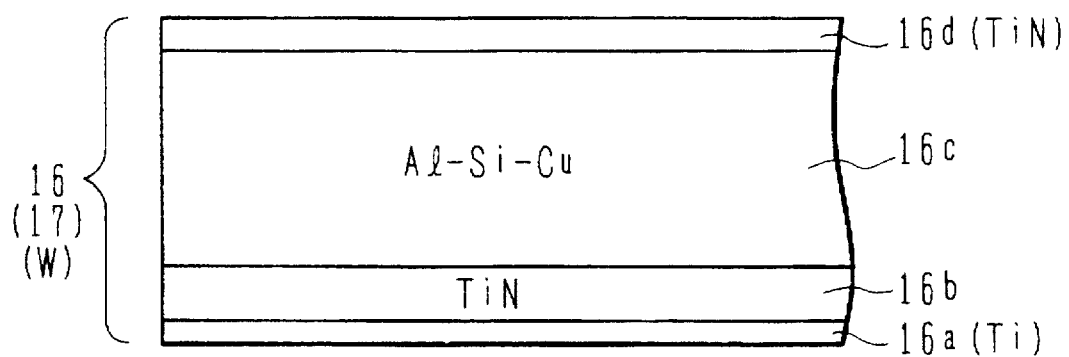
FIG. 5 is a cross sectional view showing an example of a wiring layer.

A different point of the device shown in FIG. 4 from the device shown in FIG. 3 is that a wiring material layer 19 covering the gate electrode layer G is formed on the insulating film 14 by the same process of forming the wiring layers 16 and 17. The wiring material layer 19 has the structure, for example, such as shown in FIG. 5, and may be connected to one of the wiring layers 16 and 17 or may be separated from both the wiring layers 16 and 17.

With the structure shown in FIG. 4, moisture diffusion from the insulating film 18 into a region under the gate electrode layer G can be blocked by the wiring material layer 19. Therefore, resistance to hot carriers can be prevented from being degraded. However, studies made by the present inventors have revealed another problem that the interface state density at the interface between Si and gate oxide cannot be lowered sufficiently at the final annealing process. If the interface state density cannot be lowered sufficiently, the subthreshold slope remains large so that the threshold voltage becomes high and the switching speed lowers. Table 1 shows the structure of the wiring layers 16 and 17, wiring material layer 19, and interlayer insulating film 18 of Samples 1 to 4 of transistors shown in FIGS. 3 and 4.

TABLE 1

| Sample | | 1 | 2 | 3 | 4 |
|---|---|---|---|---|---|
| 16, 17 in FIG. 3 or 16, 17, 19 in FIG. 4 | | | TiN/Al alloy/TiON/Ti Ti = 20 nm | Ti = 40 nm | WSi/ Al alloy/ Wsi |
| 18 in FIG. 3 or in FIG. 4 | 24 | TEOS | TEOS | TEOS | TEOS |
| | 22 | SOG | etch-back SOG | etch-back SOG | etch-back SOG |
| | 20 | TEOS | TEOS | TEOS | TEOS |

In Table 1, representation in the form of "P/Q/R" indicates a lamination of an R layer, a Q layer, and a P layer stacked in this order from the bottom. "Ti=" indicates a thickness of a Ti layer, and "Al alloy" indicates Al-Si-Cu alloy. For the insulating film 18, "TEOS" indicates a silicon oxide film formed by plasma-enhanced CVD using TEOS. "SOG" indicates an SOG film, and "etch-back SOG" indicates that after an SOG film of 500 nm thick is formed through spin-coating, it is etched back 500 nm thick (i.e., SOG is removed from a flat surface and left only in a concave area).

The insulating film 14 is a BPSG film of 750 nm thick. Both the silicon oxide films 20 and 24 are 500 nm thick, and the SOG film 22 is 500 nm thick. The passivation film 28 is a silicon nitride film of 1000 nm thick.

Table 2 shows the measurement results of a subthreshold slope for Samples 1 to 4 shown in Table 1. The unit of each data of the samples is mV/decade.

TABLE 2

| | SUBTHRESHOLD SLOPE (mV/decade) | | | |
|---|---|---|---|---|
| | Sample | | | |
| Transistor | 1 | 2 | 3 | 4 |
| FIG. 3 | 85.6 | 85.9 | 85.9 | 85.7 |
| FIG. 4 | 85.7 | 91.7 | 95.5 | 85.6 |

A change amount $\Delta S$ of the subthreshold slope is proportional to $\Delta Dit$ where $\Delta Dit$ is a change amount of the interface state density ($\Delta S \propto \Delta Dit$). As seen from Tables 1 and 2, Samples 2 and 3 having the structure shown in FIG. 4 showed less lowering of an interface state density than the other samples. Sample 3 having the lowest Ti layer of 40 nm thick of the wiring material layer 19, instead of 20 nm thick of Samples 1 and 2, showed insufficiently lesser lowering of an interface state density.

It is desired that an interface state density is lowered sufficiently even for a semiconductor device having a wiring layer covering the gate electrode layer for preventing resistance to hot carriers from being degraded.

As seen from Tables 1 and 2, Sample 4 having the WSi/Al alloy/WSi structure has a sufficiently lowered interface state density for both the transistors shown in FIGS. 3 and 4. Sample 1 having the structure (SOG non-etch-back structure) containing a plenty of moisture in the insulating film 18 has a sufficiently lowered interface state density for both the transistors shown in FIGS. 3 and 4, regardless of the Ti layer used as the lowest layer of the wiring material layer 19. In contrast, for the Samples 2 and 3 having the structure (SOG etch-back structure) containing less moisture in the insulating film 18, the interface state density cannot be lowered sufficiently if the Ti layer is used as the lowest layer of the wiring material layer 19. Ti has so a strong property of adsorption and absorption of gas molecules that it is even used as a vacuum pump (Ti getter pump). It can be considered that compositions generated due to moisture or moisture derivatives (collectively called moisture related species) and diffusing in the insulating film 14 covering the gate electrode, are adsorbed or absorbed by Ti when they become in contact with it.

It is generally said that trivalent Si (Si≡Si) at the Si/SiO$_2$ interface is terminated by H (Si≡Si–H) at the final annealing process and the interface state density is lowered. However, according to the experiments of the inventors, the interface state density was lowered even if the final annealing process was performed in a nitrogen atmosphere. The inventors now consider that moisture related species (H$_2$O, OH$^-$, H$^+$) in the insulating film 18 diffuse to the Si/SiO$_2$ interface during the final annealing process and are terminated in the form of (Si≡Si–H, Si≡Si–OH).

If a Ti layer absorbing and storing moisture related species (H$_2$O, OH$^-$, H$^+$) is formed just above a transistor, the concentration of moisture related species in lowered near at the transistor, and the interface state density cannot be lowered (Samples 2 and 3). The more is the Ti amount, the more insufficiently the interface state density is lowered (Sample 3). If the insulating film 18 contains sufficient moisture, a sufficient concentration of moisture related species is ensured even if part of the moisture is absorbed and stored in the Ti layer, so that the interface state density can be lowered (Sample 1). If a layer not absorbing and storing moisture related species is formed just above a transistor, the concentration of moisture related species does not lower and the interface state density can be lowered (Sample 4).

If a wiring layer having a Ti layer as the lowest layer is used for the contact with an Si surface, low contact resistance is easy to obtain. It is even said that a small amount of oxide film or the like on the Si surface is consumed by the Ti layer. Ti is also useful for the connection between wiring layers. For these facts, it is desired to use a Ti layer while blocking the function of Ti layer of adsorbing and absorbing diffusion species such as moisture related species above the gate insulating film. This impervious function can be realized by inserting a silicon nitride film between the Ti layer and an underlying layer. In order not to block the diffusion of moisture related species from the upper level layer, an opening or openings are formed in the silicon nitride film. This can be achieved by patterning the silicon nitride film together with the Ti layer.

Even if other materials are used instead of silicon nitride, similar effects can be expected if they have the same or similar function. Those moisture impervious materials which have a function of blocking moisture (inclusive of its derivative) can be employed. Specifically, absorption blocking materials can be used which have a capability of blocking the absorption of moisture related species by the Ti layer.

In the prior structure proposed by one of the inventors, although an electrode layer structure is formed which covers the gate electrode and is used as a layer for blocking the diffusion of moisture related species, the Ti layer is maintained in direct contact with the underlying insulating layer. Therefore, H$^+$ diffusing in the insulating layer is absorbed in the Ti layer and exhausted, and dangling bonds at the interface between the silicon substrate and gate insulating film cannot be terminated sufficiently, being unable to sufficiently lower the interface state density.

By forming a blocking layer such as SiN layer on or over the insulating layer, the H$^+$ adsorption and absorption function of Ti can be blocked and the interface state density can be lowered. It is therefore possible to improve the operation speed of MOS transistors and other devices formed on a silicon substrate.

An embodiment of the invention will be described with reference to the accompanying drawings. FIGS. 1A to 1I are cross sectional views illustrating a method of manufacturing a semiconductor device. FIG. 1I also shows the structure of a manufactured semiconductor device. FIG. 2 is a plan view showing the structure of the device shown in FIG. 1I. FIGS. 1A to 1I are cross sectional views taken along line X–X' in FIG. 2.

Figure 1A:
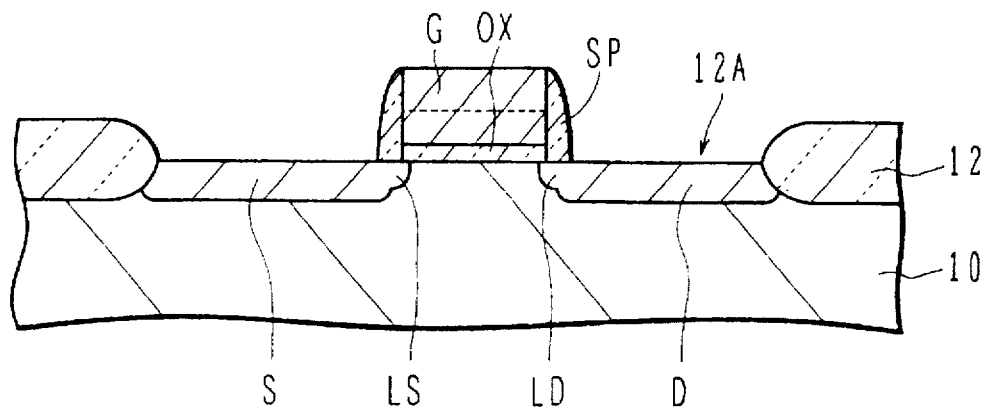
FIGS. 1A to 1I are cross sectional views of a substrate illustrating a method of manufacturing a semiconductor device according to an embodiment of the invention.
Figure 2:
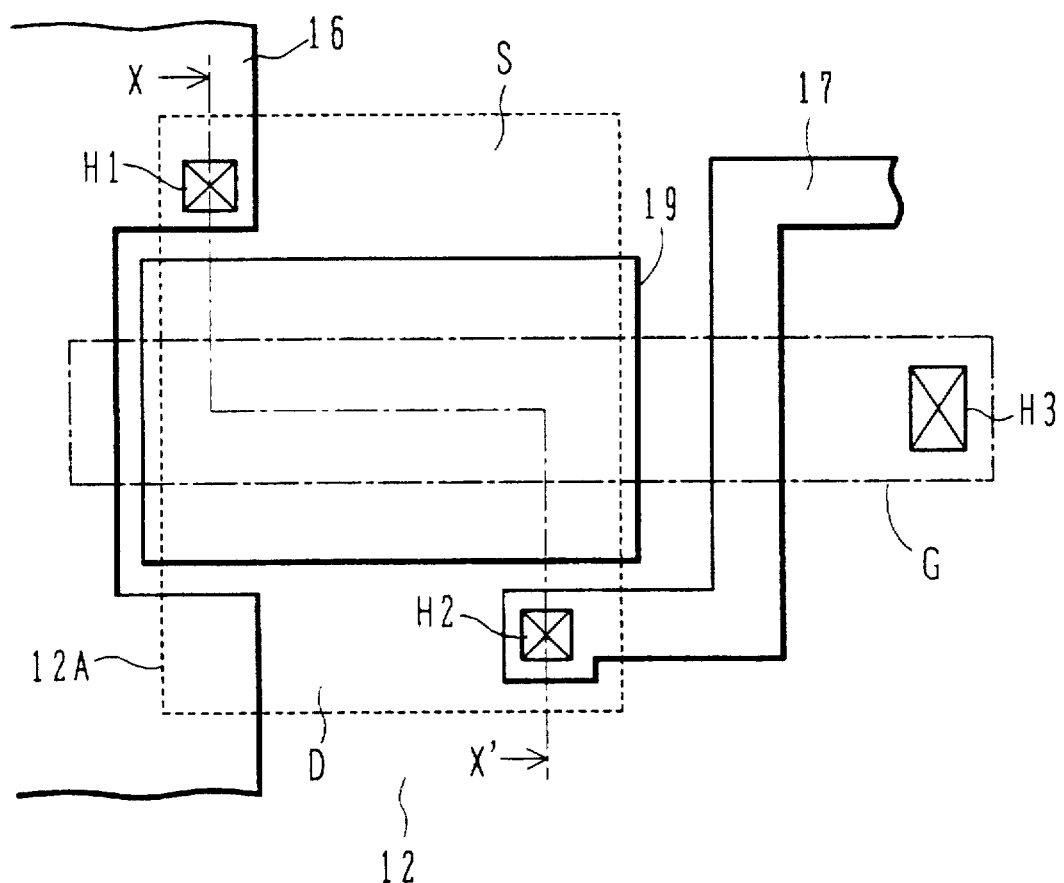
FIG. 2 is a plan view showing the wiring pattern of the device shown in FIGS. 1A to 1I.

As shown in FIG. 1A, on the surface of a semiconductor substrate 10 made of, for example, p-type silicon, a field oxide film 12 (also refer to FIG. 2) is formed surrounding an active region 12A, by well known local oxidation of silicon (LOCOS). LOCOS is performed by a known process using a silicon nitride mask. If a complementary (C) MOS IC is to be formed, LOCOS may be performed after a well having the opposite conductivity type as the substrate or wells having the same and opposite conductivity types are formed. In this case, the region 10 may be assumed to be a well formed in the substrate.

Next, a gate oxide film OX is formed on the surface of the active region 12A, and a gate electrode layer G is formed on the gate oxide film OX. The gate electrode layer may be a polysilicon layer or a polycide layer made of a polysilicon layer and a silicide layer such as WSi formed on the polysilicon layer.

A resist mask is formed on the gate electrode layer to pattern a gate electrode G having a gate length of, for example, 0.5 μm by anisotropic etching.

By using the gate electrode G and field oxide film 12 as a mask, n-type impurities (e.g., P, As) are lightly implanted to form lightly doped source/drain regions LS and LD.

Next, an insulating film such as SiO$_2$ for side spacers is conformally formed by CVD. This insulating film is anisotropically etched to leave side spacers only on the side walls of the insulated gate electrode structure. By using the gate electrode structure G and OX, side spacers SP, and field oxide film 12 as a mask, n-type impurities P or As are again heavily doped to form a source region S and a drain region D of high impurity concentration. Here, the terms "source" and "drain" are only illustrative or for convenience and they may be interchanged. In the above manner, a MOS transistor structure is formed.

Figure 1B:
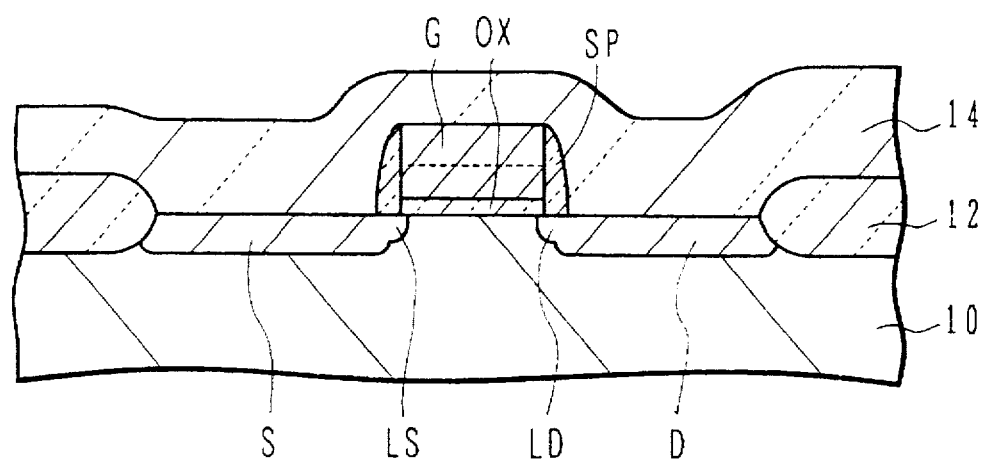

As shown in FIG. 1B, a first interlayer insulating film 14 is formed over the substrate, covering the MOS transistor structure. The insulating film 14 is, for example, a BPSG film of 750 nm thick formed by CVD. Thereafter, a heat treatment at 850° C. is performed to planarize the surface of the BPSG film.

Figure 1C:
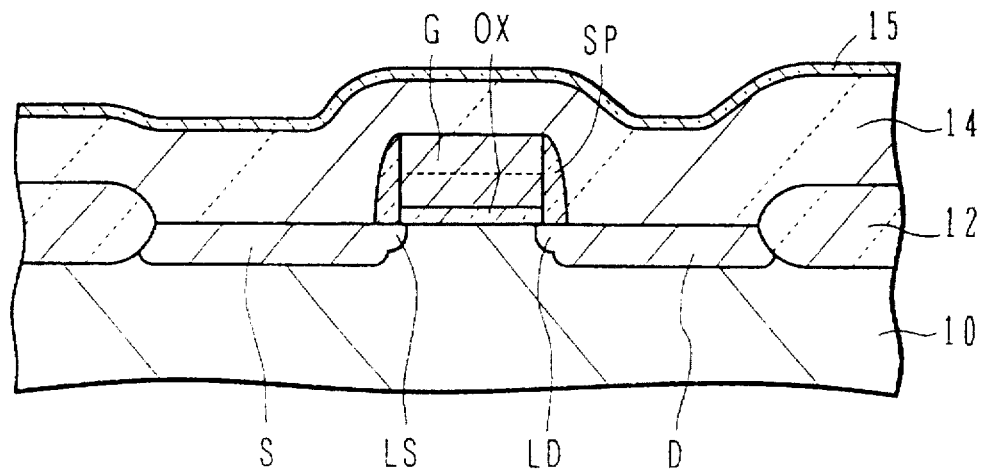

As shown in FIG. 1C, a blocking film 15 for blocking moisture related species, for example, a silicon nitride (SiN) film, is formed to a thickness of 10 nm by plasma-enhanced CVD. An example of the manufacturing conditions is as follows:

SiH$_4$ flow rate: 24 sccm,
NH$_3$ flow rate: 20 sccm,
N$_2$ flow rate: 600 sccm,
Total pressure: 1 Torr,
Power: 180 W (13.56 MHz), and
Substrate temperature: 400° C.

An SiN film blocks a flow of H$^+$, OH$^+$, H$_2$O, and other moisture related species, and has no function of absorbing and storing moisture related species.

In the state shown in FIG. 1C, hydrogen is difficult to diffuse in a layer under the blocking film 15.

The silicon nitride film may also be formed by silicon reactive sputtering instead of plasma-enhanced CVD. The thickness of the silicon nitride film is preferably 50 nm or thinner because it should be selectively etched at a later dry etching process. Instead of silicon nitride, other materials capable of blocking the diffusion of moisture related species may also be used.

Figure 1D:
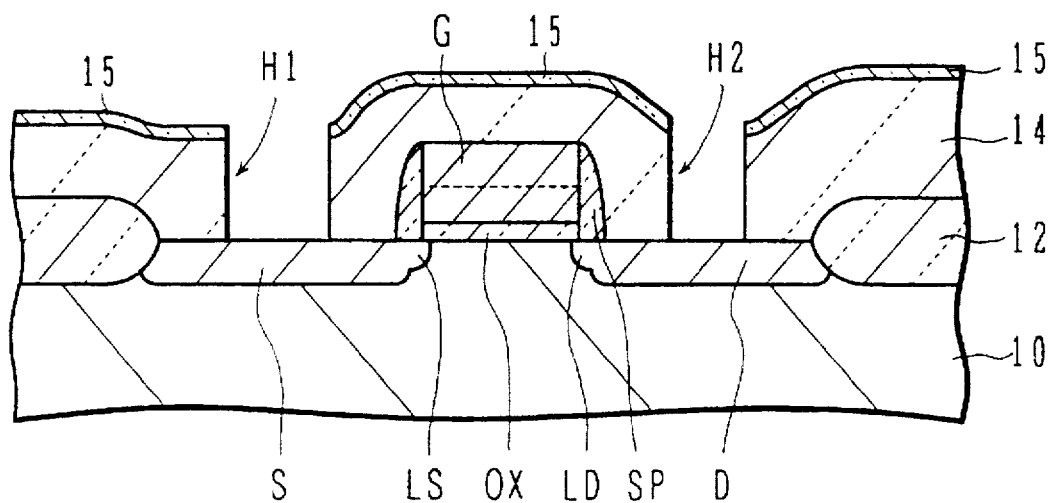

Next, as shown in FIG. 1D, a resist mask is formed on the silicon nitride film 15, and the blocking film 15 and insulating film 14 are anisotropically etched to form contact holes H1 and H2 reaching the substrate surface and partially exposing the source region S and drain region D.

Figure 1E:
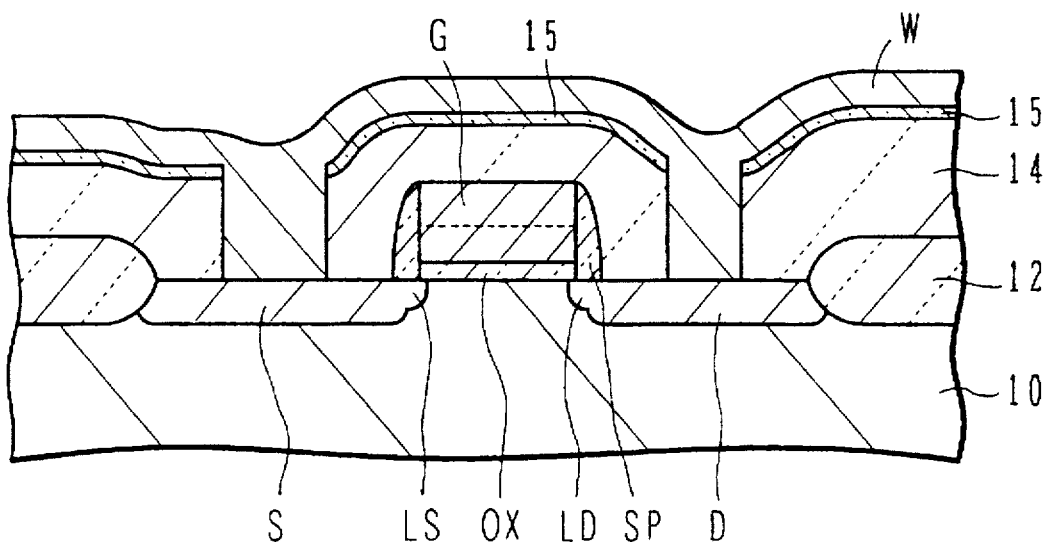

As shown in FIG. 1E, a wiring layer W is deposited over the blocking film 15 with the contact holes H1 and H2. The wiring layer W is, for example, a laminate of a Ti layer, a TiN layer, an Al-Si-Cu alloy layer, and a TiN layer stacked in this order from the bottom, such as shown in FIG. 5. The function of each layer has been described with reference to FIG. 5. It is to be noted here that the lowest layer is made of a metal (e.g. Ti) having a property of adsorbing and absorbing moisture related species ($H^+$, $OH^-$, $H_2O$). The other layers may be made of materials which can provide intended functions. For example, in place of Al-Si-Cu alloy, Al or other Al alloy (AlSi, Al-Cu) may be used. TiON may be used instead of TiN.

Figure 1F:
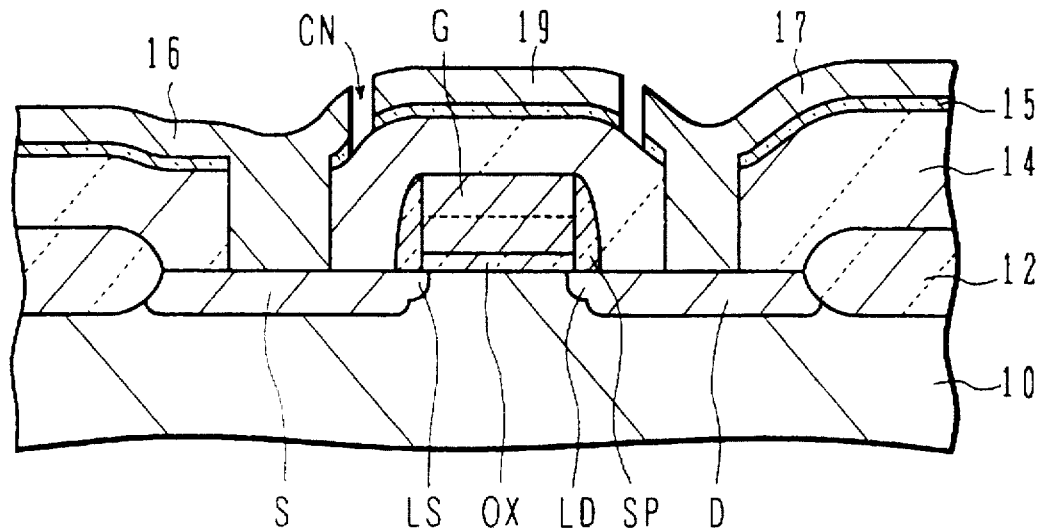

As shown in FIG. 1F, a resist mask is formed on the wiring layer W, and the wiring layer W and silicon nitride film 15 are anisotropically etched to form a source wiring layer 16, a drain wiring layer 17, and a wiring material layer 19 each having an underlying silicon nitride film. The wiring material layer 19 is patterned to cover the gate electrode layer G as shown in FIG. 2. It may be connected to one of the source and drain electrodes 16 and 17.

The wiring material layer 19 includes a moisture impervious film (Ti) and has a moisture absorbent property of adsorbing and storing moisture contents, which blocks the downward diffusion of moisture.

In the example shown in FIG. 2, the wiring material layer 19 is formed separately from the wiring layers 16 and 17. If desired, the wiring material layer 19 may be formed contiguous to either the wiring layer 16 or 17. The wiring layers 16 and 17 are connected to the source region S and the drain region D, respectively, in the contact holes H1 and H2. An unrepresented gate wiring layer is connected to the gate electrode layer G in a gate contact hole H3 (FIG. 2). Since the silicon nitride film 15 is patterned with the wiring layer W, the bottom of each wiring layer is covered with the silicon nitride film. However, there are areas CN with the silicon nitride film being removed, where the insulating layer 14 is exposed.

The distance between the patterned spaces CN without a laminate of the Ti film and blocking film 15 is set wider than the gate width when the spaces are projected on the substrate surface. Therefore, the gate electrode is covered with the gate wiring material layer 19 in the width direction.

The spaces CN allow $H^+$ to diffuse from a second interlayer insulating film to be formed next, into the underlying insulating film 14. Although $H_2O$ and $OH^-$ degrading hot carrier resistance are also supplied to the insulating film 14, these species are difficult to reach the gate electrode because the wiring material layer 19 covering the gate electrode is formed over the gate electrode G to elongate the distance between CN areas and gate electrode G. Furthermore, these species as $H_2O$ and $OH^-$ have a slow diffusion speed in the insulating film 14 so that they hardly degrade the hot carrier resistance. A combination of the Ti film, the blocking film and the spaces CN can constitute a kind of filter which passes only $H^+$ toward the gate by a predetermined amount sufficient for lowering the interface state density.

An example of the wiring layer structure is TiN/Al-SiCu/ TiON/Ti =40/400/100/20 nm. A TiN layer may be used instead of the TiON layer. The dry etching may be performed under the conditions of a gas flow rate of $Cl_2/BCl_3$=30/30 sccm and a pressure of 10 mTorr. The blocking film 15 is selectively etched by the over-etching after the dry etching of the wiring material, in the same pattern as the layers 16, 17 and 19. This over-etch can make the insulating film 14 in contact with the second interlayer insulating film 18 to be formed next.

Figure 1G:
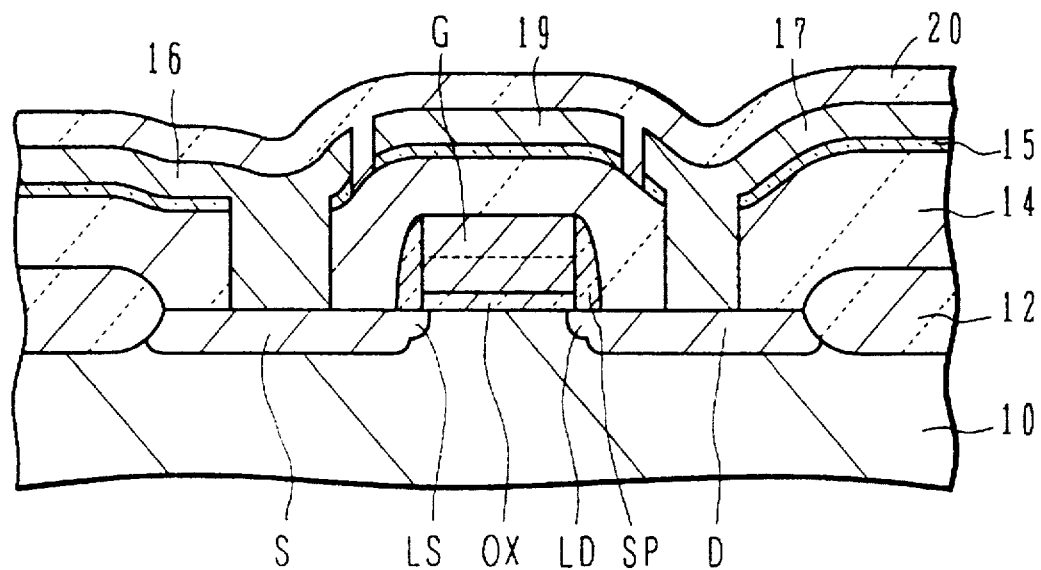

As shown in FIG. 1G, an $SiO_2$ film 20 is formed over the wiring layers to a thickness of, for example, 500 nm, through plasma-enhanced CVD using tetraethylorthosilicate (TEOS).

Figure 1H:
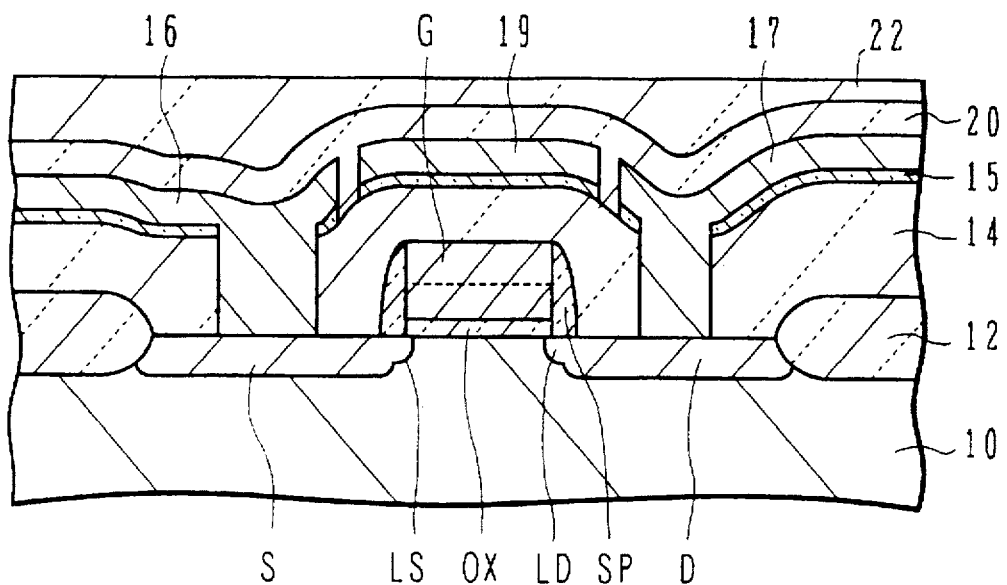
Figure 1I:
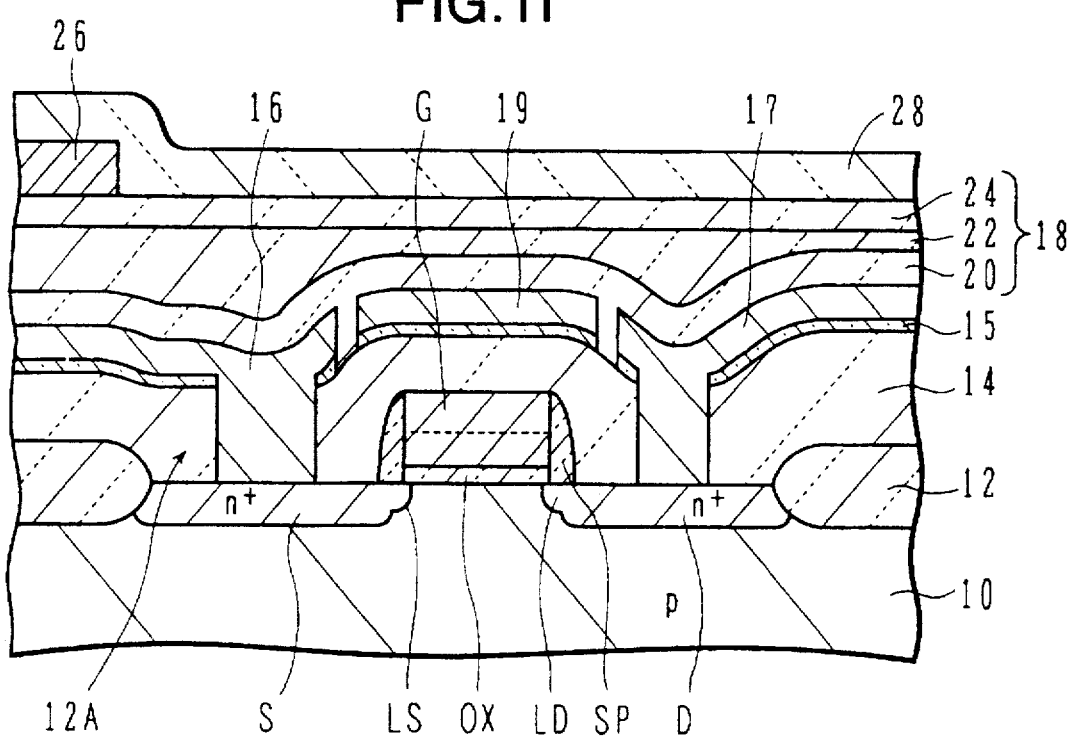

As shown in FIG. 1H, on the TEOS oxide film 20, an SOG film 22 is spin coated to a thickness of, for example, 500 nm at the flat area. The surface of the SOG film is planarized.

As shown in FIG. 1I, on the SOG film 22, another TEOS oxide film 24 is formed to a thickness of, for example, 500 nm by plasma-enhanced CVD. In this manner, the interlayer insulating film 18 is formed with the SOG film 22 being sandwiched between a pair of CVD oxide films 20 and 24.

Prior to the formation of the silicon oxide film 24, the SOG film 22 may be etched back 500 nm thick from the surface thereof. The insulating film obtained has less moisture than the insulating film whose SOG film 22 is not etched back.

Next, after necessary via holes are formed in the insulating film 18, a second level wiring layer 26 is deposited on the insulating film 18. A passivation film 28 is formed on the insulating film 18, covering the second level wiring layer 26. For example, the passivation film 28 is a silicon nitride film of 1000 nm thick formed by plasma-enhanced CVD.

Thereafter, a final annealing process is performed, for example, under an atmosphere containing $N_2$ and $H_2$, at 400° C., and for 30 minutes. The transistor shown in FIG. 1I has a sufficiently lowered interface state density.

In the above embodiment, diffusion of moisture from the insulating film 18 to the gate electrode layer G is blocked by the wiring layer 19, so that hot carrier resistance can be prevented from being degraded. Furthermore, provision of the blocking layer 15 between the lowest Ti layer of the wiring material layer 19 and the insulating film 14, while ensuring a contact between the first and second interlayer insulating films 14 and 18, can block the adsorption and storing of moisture related species by the Ti layer so that the interface state density can be sufficiently lowered.

The present invention has been described in connection with the preferred embodiments. The invention is not limited only to the above embodiments. For example, semiconductor devices having three or more wiring layers can be formed, and wiring materials can be changed. It is apparent to those skilled in the art that various other modifications, improvements, combinations and the like can be made without departing from the scope of the appended claims.

We claim:

1. A semiconductor device comprising:
   (a) a substrate having an active element in a first region;
   (b) a first interlayer insulating layer formed over the active element and having a connection hole;
   (c) a laminated conductive wiring structure formed over the first interlayer insulating layer, wherein the conductive wiring structure includes a sub-layer at a bottom thereof which is in contact with the first region through the connection hole;

(d) a first moisture impervious film made of insulating material and formed over the first interlayer insulating layer over the active element;

(e) a second moisture impervious layer formed over the active element and the first moisture impervious layer, the second moisture impervious layer having a hydrogen absorbing property, the first and second moisture impervious layers having respective communicating holes over the active element to expose a part of the first interlayer insulating layer, wherein the second moisture impervious layer is made of conductive material and the second moisture impervious layer and the sub-layer of the laminated wiring structure are made of the same material;

(f) a second interlayer insulating layer, which includes moisture contents therein which can degrade performance of the active element, formed over the first moisture impervious layer and the second moisture impervious layer, the hydrogen content of the moisture contents diffusing therefrom down to the first interlayer insulating layer.

2. A semiconductor device according to claim 1, wherein the first moisture impervious layer is made of silicon nitride.

3. A semiconductor device according to claim 2, wherein the first moisture impervious layer is made plasma enhanced chemical vapor deposition through (PECVD).

4. A semiconductor device according to claim 1, wherein the second moisture impervious layer comprises:

(c-1) a titanium layer;
(c-2) a first titanium nitride layer;
(c-3) an aluminum alloy layer; and
(c-4) a second titanium nitride layer, the titanium, first titanium nitride, aluminum alloy and second titanium nitride layers collectively serving as the second moisture impervious layer.

5. A semiconductor device according to claim 1, wherein the interlayer insulating layer comprises:

(d-1) a first sub-interlayer insulating layer;
(d-2) a second sub-interlayer insulating layer; and
(d-3) A third sub-interlayer insulating layer.

6. A semiconductor device according to claim 5, wherein the first and third sub-interlayer insulating layers are made through plasma enhanced chemical vapor deposition (PECVD) with tetraethylorthosilicate (TEOS).

7. A semiconductor device according to claim 5, wherein the second sub-interlayer insulating layer is made of spin-on-glass material.

8. A semiconductor device according to claim 1, wherein the active element is a MOS transistor.

9. A semiconductor device comprising:

(a) a semiconductor substrate having an active element;

(b) a first interlayer insulating layer over the semiconductor substrate and the active element and having a connection hole;

(c) a laminated conductive wiring structure formed over the first interlayer insulating layer, wherein the conductive wiring structure includes a sub-layer at a bottom thereof which is in contact with the first region through the connection hole;

(d) a first moisture impervious layer made of insulating material and being held in contact with the first interlayer insulating layer over the active element;

(e) a second moisture impervious layer having a titanium layer at a lowermost layer, the second moisture impervious layer being held in contact with the first moisture impervious layer, the first and second moisture impervious layers having respective communicating holes over the active element to expose a part of the first layer insulating layer, wherein the second moisture impervious layer is made of conductive material and the second moisture impervious layer and the sub-layer of the laminated wiring structure are made of the same material; and (f) a second interlayer insulating layer, which includes moisture contents therein which can degrade performance of the active element, formed over the first moisture impervious layer and the second moisture impervious layer, the hydrogen content of the moisture contents diffusing therefrom down to the first interlayer insulating layer.

10. A semiconductor device according to claim 9, wherein the first interlayer insulating layer is made of borophosphosilicate glass (BPSG).

11. A semiconductor device according to claim 9, wherein the first moisture impervious layer is made of silicon nitride.

12. A semiconductor device according to claim 11, wherein the first moisture impervious layer is made plasma enhanced chemical vapor deposition through (PECVD).

13. A semiconductor device according to claim 9, wherein the second moisture impervious layer comprises:

(d-1) a titanium layer;
(d-2) a first titanium nitride layer;
(d-3) an aluminum alloy layer; and
(d-4) a second titanium nitride layer, the titanium, first titanium nitride, aluminum alloy and second titanium nitride layers collectively serving as the second moisture impervious layer.

14. A semiconductor device according to claim 9, wherein the second interlayer insulating layer comprises:

(e-1) a first sub-interlayer insulating layer;
(e-2) a second sub-interlayer insulating layer; and
(e-3) a third sub-interlayer insulating layer, wherein the first sub-interlayer insulating layer is held in contact with the first interlayer insulating layer through said communicating holes made in the first and second moisture impervious layers.

15. A semiconductor device according to claim 14, wherein the first and third sub-interlayer insulating layers are made through plasma enhanced chemical vapor deposition (PECVD) with tetraethylorthosilicate (TEOS).

16. A semiconductor device according to claim 14, wherein the second sub-interlayer insulating layer is made of spin-on-glass material.

17. A semiconductor device according to claim 9, wherein the active element is a MOS transistor.

18. A semiconductor device according to claim 13, wherein the active element is an insulated gate field effect transistor having source/drain regions, an insulated gate structure, and source/drain electrodes, each electrode comprising a stacked laminate having a same structure as said second moisture impervious layer, and the second moisture impervious layer is isolated from one of said source/drain electrodes and covers said insulated gate electrode.

19. A semiconductor device according to claim 18, wherein said first moisture impervious layer is made of silicon nitride and is interposed between said first interlayer insulating layer and a sum of said second moisture impervious layer and said source/drain electrodes.

20. A semiconductor device according to claim 19, wherein said second interlayer insulating layer comprises an SOG layer.

21. A semiconductor device comprising:

a substrate;

a an MOS transistor having source/drain regions and an insulated gate electrode and formed on a surface of the substrate;

a first interlayer insulating film formed on the surface of the substrate and covering the MOS transistor;

a moisture impervious wiring material layer formed on the first interlayer insulating film and having source/drain electrode portions contacting said source/drain regions and a protection portion covering the insulated gate electrode, the wiring material layer having a titanium layer as a lowest layer;

a second interlayer insulating film formed on the first interlayer insulating film and covering the wiring material layer, the second interlayer insulating film containing moisture; and a blocking film made of insulating material and capable of blocking moisture related species formed between the first interlayer insulating film and the titanium layer while ensuring contact between the first and second interlayer insulating films, the blocking film and said wiring material layer having respective communicating holes over the MOS transistor to expose a part of the first interlayer insulating layer, the hydrogen content of the moisture content diffusing therefrom down to the first interlayer insulating layer so as to lower an interface state density.

22. A semiconductor device according to claim 21, wherein said blocking film is mode of silicon nitride.

* * * * *